US012579412B2

(12) United States Patent
Oh

(10) Patent No.: US 12,579,412 B2
(45) Date of Patent: Mar. 17, 2026

(54) SPIKE NEURAL NETWORK CIRCUIT INCLUDING SELF-CORRECTING CONTROL CIRCUIT AND METHOD OF OPERATION THEREOF

(71) Applicant: ELECTRONICS AND TELECOMMUNICATIONS RESEARCH INSTITUTE, Daejeon (KR)

(72) Inventor: Kwang Il Oh, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 1143 days.

(21) Appl. No.: 17/538,539

(22) Filed: Nov. 30, 2021

(65) Prior Publication Data

US 2022/0253673 A1     Aug. 11, 2022

(30) Foreign Application Priority Data

Feb. 10, 2021   (KR) ........................ 10-2021-0019132
Jul. 13, 2021   (KR) ........................ 10-2021-0091508

(51) Int. Cl.
*G06N 3/049*     (2023.01)
*G06N 3/065*     (2023.01)
*H03K 3/354*     (2006.01)

(52) U.S. Cl.
CPC ............. *G06N 3/049* (2013.01); *G06N 3/065* (2023.01); *H03K 3/354* (2013.01)

(58) Field of Classification Search
CPC ......... G06N 3/049; G06N 3/065; H03K 3/354
See application file for complete search history.

(56) References Cited

U.S. PATENT DOCUMENTS 8,139,053 B2   3/2012  Higuchi
9,053,428 B2   6/2015  Hunzinger et al.
(Continued)

FOREIGN PATENT DOCUMENTS

CN       110826749     *  2/2020  ............. G06Q 10/04
JP     2008-268473 A    11/2008
(Continued)

OTHER PUBLICATIONS

Wu et al. "Deep Spiking Neural Network with Spike Count based Learning Rule," 2019 International Joint Conference on Neural Networks (IJCNN) Jul. 14-19, 2019, pp. 1-6. (Year: 2019).*

*Primary Examiner* — Kyle R Stork

(57)     ABSTRACT
Disclosed is a spike neural network circuit according to an embodiment of the present disclosure, which includes a self-correcting control circuit that generates an input signal and a first control code, a bias voltage generation circuit that generates a first bias voltage based on the first control code, a synaptic circuit including a first synaptic column that performs an operation of the input signal and a first weight signal and generates a first operation signal, a neuron circuit including a first neuron that generates a first output signal based on a comparison of the first operation signal and a threshold voltage, and a spike comparison circuit that generates a first comparison signal corresponding to a difference between the first output signal and a reference number, and the self-correcting control circuit further generates a second control code for correcting the first bias voltage.

13 Claims, 13 Drawing Sheets

(56)     References Cited

U.S. PATENT DOCUMENTS

| | | | |
|---|---|---|---|
| 11,210,577 B2 * | 12/2021 | Lee | G06N 3/04 |
| 12,050,982 B1 * | 7/2024 | Ricciulli | G06F 18/214 |
| 2008/0079474 A1 * | 4/2008 | Hurrell | H03F 3/45659 |
| | | | 327/336 |
| 2014/0365416 A1 | 12/2014 | Kim et al. | |
| 2018/0197076 A1 | 7/2018 | Paik et al. | |
| 2018/0260696 A1 * | 9/2018 | Suda | G11C 13/0002 |
| 2018/0321913 A1 * | 11/2018 | Kozicki | G06F 7/588 |
| 2019/0213472 A1 | 7/2019 | Park et al. | |
| 2022/0179840 A1 * | 6/2022 | Chatterjee | G06F 16/2365 |

FOREIGN PATENT DOCUMENTS

| | | |
|---|---|---|
| KR | 10-2013-0013013 A | 2/2013 |
| KR | 101512370 B1 | 4/2015 |
| KR | 101596656 B1 | 2/2016 |
| KR | 10-2018-0050830 A | 5/2018 |
| KR | 10-2018-0082807 A | 7/2018 |
| KR | 10-2019-0007143 A | 1/2019 |
| KR | 1020200088952 A | 7/2020 |

* cited by examiner

| Number | Weight Input(WI) | |
|--------|------------------|--|
| 1 | FF | ← PS |
| 2 | FF | ← WI4 |
| 3 | FF | |
| 4 | FF | |
| ... | ... | |
| M-2 | 0A | |
| M-1 | 0A | |
| M | 0A | ← WI1 |

FIG. 10

SPIKE NEURAL NETWORK CIRCUIT INCLUDING SELF-CORRECTING CONTROL CIRCUIT AND METHOD OF OPERATION THEREOF

CROSS-REFERENCE TO RELATED APPLICATIONS

This application claims priority under 35 U.S.C. § 119 to Korean Patent Application Nos. 10-2021-0019132, filed on Feb. 10, 2021, and 10-2021-0091508, filed on Jul. 13, 2021, respectively, in the Korean Intellectual Property Office, the disclosures of which are incorporated by reference herein in their entireties.

BACKGROUND

Embodiments of the present disclosure described herein relate to a spike neural network circuit, and more particularly, relate to a spike neural network circuit including a self-correcting control circuit and a method of operating the same.

Artificial neural networks (ANNs) may process data or information in a manner similar to biological neural networks. Unlike perceptron-based neural networks or convolution-based neural networks, in a spike neural network, a signal of a specific level is not transferred, but a spike signal including a toggling pulse for a short time may be transferred.

Spike neural network circuits may be implemented using a semiconductor device. The spike neural network circuit implemented as a semiconductor circuit may be influenced by a surrounding environment (e.g., changes in temperature, humidity, power supply voltage, etc.), and may cause an error in the operation result of the spike neural network. After the spike neural network circuit is fabricated, a spike neural network circuit capable of self-correcting changes in the surrounding environment is needed.

SUMMARY

Embodiments of the present disclosure provide a spike neural network circuit including a self-correcting control circuit and a method of operating the same.

According to an embodiment of the present disclosure, a spike neural network circuit includes a self-correcting control circuit that generates an input signal and a first control code, a bias voltage generation circuit that generates a first bias voltage based on the first control code, a synaptic circuit including a first synaptic column that performs an operation of the input signal and a first weight signal based on the first bias voltage and generates a first operation signal, a neuron circuit including a first neuron that generates a first output signal based on a comparison of the first operation signal and a threshold voltage, and a spike comparison circuit that generates a first comparison signal corresponding to a difference between the first output signal and a reference number, and the self-correcting control circuit further generates a second control code for correcting the first bias voltage based on the first control code and the first comparison signal.

According to an embodiment, the bias voltage generation circuit may further generate a second bias voltage based on the first control code, the synaptic circuit may further include a second synaptic column that performs an operation of the input signal and a second weight signal based on the second bias voltage and generates a second operation signal, the neuron circuit may further include a second neuron that generates a second output signal based on a comparison of the second operation signal and the threshold voltage, the spike comparison circuit may further generate a second comparison signal corresponding to a difference between the second output signal and the reference number, and the self-correcting control circuit may further generate a third control code based on the first control code and the second comparison signal.

According to an embodiment, the bias voltage generation circuit may generate a third bias voltage obtained by correcting the first bias voltage for the first synaptic column, based on the second control code, and the bias voltage generation circuit may further generate a fourth bias voltage obtained by correcting the second bias voltage for the second synaptic column, based on the third control code.

According to an embodiment, the bias voltage generation circuit may further generate a second bias voltage obtained by correcting the first bias voltage for the first synaptic column, based on the second control code, and the number of a plurality of pulses included in the first output signal may be greater than the reference number, and the second bias voltage may be less than the first bias voltage.

According to an embodiment, the bias voltage generation circuit may further generate a second bias voltage obtained by correcting the first bias voltage for the first synaptic column, based on the second control code, and the number of a plurality of pulses included in the first output signal may be equal to the reference number, and the second bias voltage may be equal to the first bias voltage.

According to an embodiment, the bias voltage generation circuit may further generate a second bias voltage obtained by correcting the first bias voltage for the first synaptic column, based on the second control code, and the number of a plurality of pulses included in the first output signal may be greater than the reference number, and the second bias voltage may be less than the first bias voltage.

According to an embodiment, the first synaptic column may include a plurality of synapses, each of the plurality of synapses may generate at least a portion of the first operation signal, based on the first bias voltage, the input signal, and a corresponding weight, and the neuron may generate a pulse of the first output signal when a magnitude of the first operation signal is greater than or equal to the threshold voltage.

According to an embodiment, the spike comparison circuit may include a counter that generates a count signal indicative of the number of a plurality of pulses of the first output signal, and a comparator that generates the first comparison signal based on the count signal and the reference number.

According to an embodiment, the second control code may be a sum of the first control code and the first comparison signal.

According to an embodiment, when the count signal is greater than the reference number, the first comparison signal may indicate a first operation value, when the count signal is less than the reference number, the first comparison signal may indicate a second operation value, and when the count signal is equal to the reference number, the first comparison signal may indicate a third operation value.

According to an embodiment, the spike neural network circuit may include a plurality of synaptic columns and a neuron circuit. According to an embodiment of the present disclosure, a method of operating a spike neural network circuit includes generating a first bias voltage corresponding to a first synaptic column among the plurality of synaptic columns, based on a first control code, performing an operation on a first input signal and a first weight signal based on the first bias voltage and generating a first operation signal, by the first synaptic column, comparing the first operation signal and a threshold voltage and generating a first output signal, by the neuron circuit, generating a first comparison signal corresponding to a difference between the first output signal and a reference number, and generating a second control code for correcting the first bias voltage, based on the first comparison signal and the first control code.

According to an embodiment, the method may further include generating a second bias voltage obtained by correcting the first bias voltage for the first synaptic column, based on the second control code, and the number of a plurality of pulses included in the first output signal may be greater than the reference number, and the second bias voltage may be less than the first bias voltage.

According to an embodiment, the method may further include generating a second bias voltage obtained by correcting the first bias voltage for the first synaptic column, based on the second control code, and the number of a plurality of pulses included in the first output signal may be equal to the reference number, and the second bias voltage may be equal to the first bias voltage.

According to an embodiment, the method may further include generating a second bias voltage obtained by correcting the first bias voltage for the first synaptic column, based on the second control code, and the number of a plurality of pulses included in the first output signal may be less than the reference number, and the second bias voltage may be greater than the first bias voltage.

According to an embodiment, the method may further include generating a second bias voltage corresponding to a second synaptic column among the plurality of synaptic columns, based on a first control code, performing an operation of the input signal and a first weight signal based on the second bias voltage, the second synaptic column and generating a second operation signal, comparing the second operation signal and the threshold voltage and generating a second output signal, by the neuron circuit, generating a second comparison signal corresponding to a difference between the second output signal and the reference number, and generating a third control code for correcting the second bias voltage, based on the second comparison signal and the first control code.

BRIEF DESCRIPTION OF THE FIGURES

The above and other objects and features of the present disclosure will become apparent by describing in detail embodiments thereof with reference to the accompanying drawings.

FIG. 7 is a diagram specifically illustrating a synapse according to an embodiment of the present disclosure.

FIG. 9 is a diagram specifically illustrating a weight input according to an embodiment of the present disclosure.

FIG. 10 is a diagram specifically illustrating a spike comparison circuit according to an embodiment of the present disclosure.

DETAILED DESCRIPTION

Hereinafter, embodiments of the present disclosure will be described clearly and in detail such that those skilled in the art may easily carry out the present disclosure.

Figure 1:
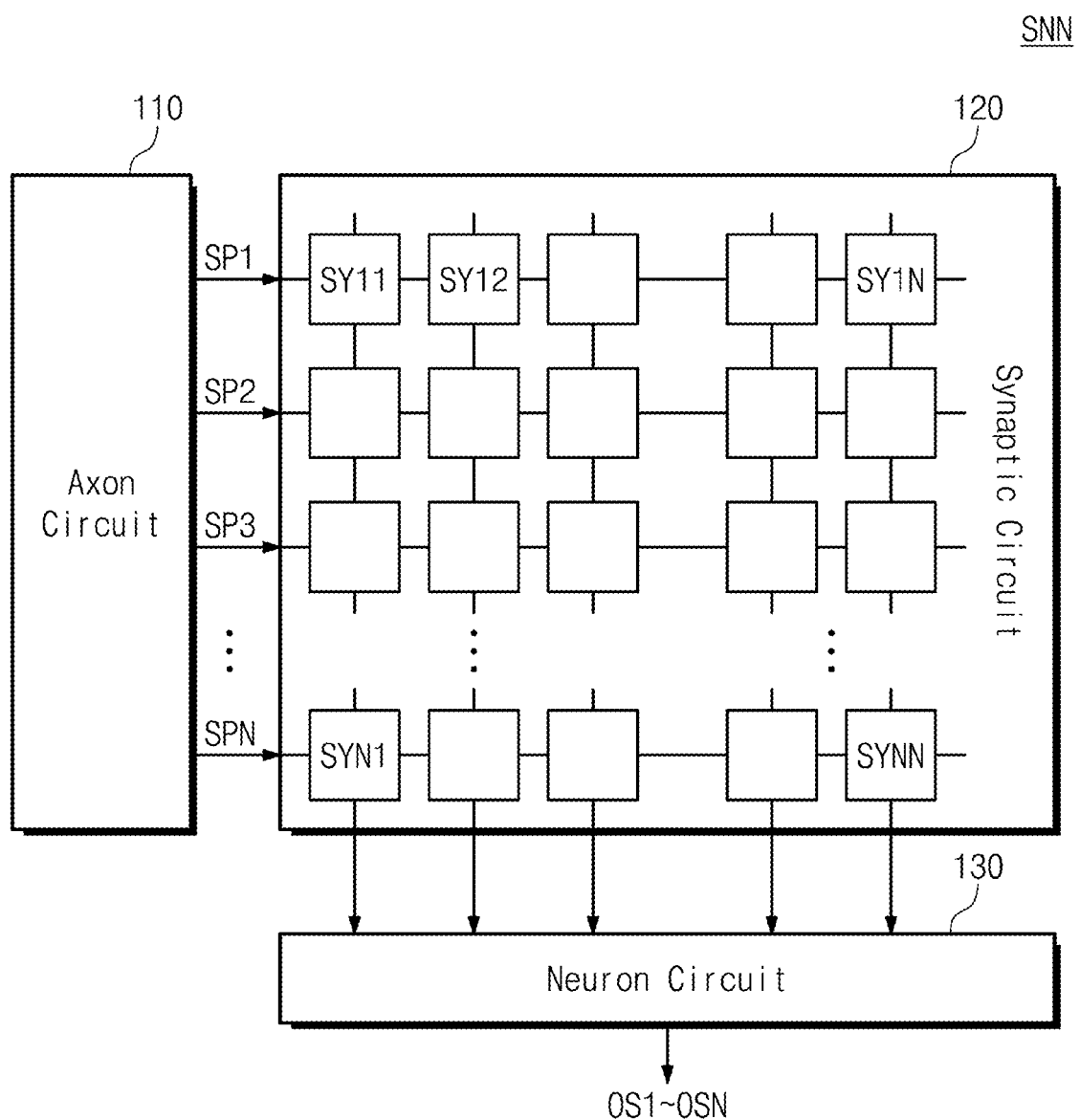
FIG. 1 is a block diagram specifically illustrating a general spike neural network circuit.

FIG. 1 is a block diagram illustrating a general spike neural network circuit as an example. Referring to FIG. 1, a spike neural network circuit SNN may include an axon circuit 110, a synaptic circuit 120, and a neuron circuit 130.

The axon circuit 110 may include axons that generate input signals SP1 to SPN. The axon of the axon circuit 110 may perform a function of outputting a signal to another neuron similarly to an axon of a biological neural network.

For example, each of the axons of the axon circuit 110 may generate the input signals SP1 to SPN based on data or information input from the outside to the spike neural network circuit SNN.

For another example, each of the axons of the axon circuit 110 may receive output signals OS1 to OSN output from the neuron circuit 130 according to the input signals SP1 to SPN transmitted to the synaptic circuit 120, and then may generate new input signals based on the output signals OS1 to OSN.

The input signals SP1 to SPN may be pulse signals that toggle for a short time. The axon circuit 110 may generate the input signals SP1 to SPN and may transmit them to the synaptic circuit 120.

The synaptic circuit 120 may connect the axon circuit 110 to the neuron circuit 130. The synaptic circuit 120 may include first to N-th synaptic columns. Each of the first to N-th synaptic columns may include a plurality of synapses. For example, the first synaptic column may include a plurality of synapses SY11 to SYN1, and the N-th synaptic column may include a plurality of synapses SYN1 to SYNN.

Each of the synapses SY11 to SYNN may determine whether the axons of the axon circuit 110 are connected to the neurons of the neuron circuit 130 and the strength of the connection. Each of the synapses SY11 to SYNN may have a unique weight.

Each of the synapses SY11 to SYNN may receive an input signal and apply a weight to the input signal. The weight may be a numerical value that represents a correlation between the axon and the neuron as the above-mentioned, the strength of the connection between the axons of the axon circuit 110 and the neurons of the neuron circuit 130, a correlation between the neurons of the neuron circuit 130 with respect to the input signal, etc.

Each of the synapses SY11 to SYNN may generate an operation signal based on an input signal and a weight and may output an operation signal to the neuron circuit 130.

The neuron circuit may include a plurality of neurons. Each of the neurons may be connected to the first to N-th synaptic columns of the synaptic circuit 120. Each of the neurons may receive operation signals in which weights are applied to the input signals SP1 to SPN from the first to N-th synaptic columns. Each of the neurons may perform a function of receiving a signal output from another neuron, similar to a dendrite of a biological neural network.

Each of the neurons may compare a voltage of a signal in which operation signals of each of the synapses SY11 to SYNN are accumulated with a threshold voltage, and may generate a pulse when the voltage of the accumulated signal is greater than the threshold voltage.

The output signals OS1 to OSN of the neuron circuit 130 may be provided back to the axon circuit 110, may output to the outside of the spike neural network circuit SNN, or may output to other elements of the spike neural network circuit SNN.

In the spike neural network circuit 100, an error may occur in the operation of the spike neural network circuit 100 due to environmental influences such as temperature, humidity, etc. In detail, the actual output signals of the spike neural network circuit 100 may be different (e.g., a difference of the number of pulses of the output signal) from output signals targeted at the time of design depending on the surrounding environment.

Figure 2:
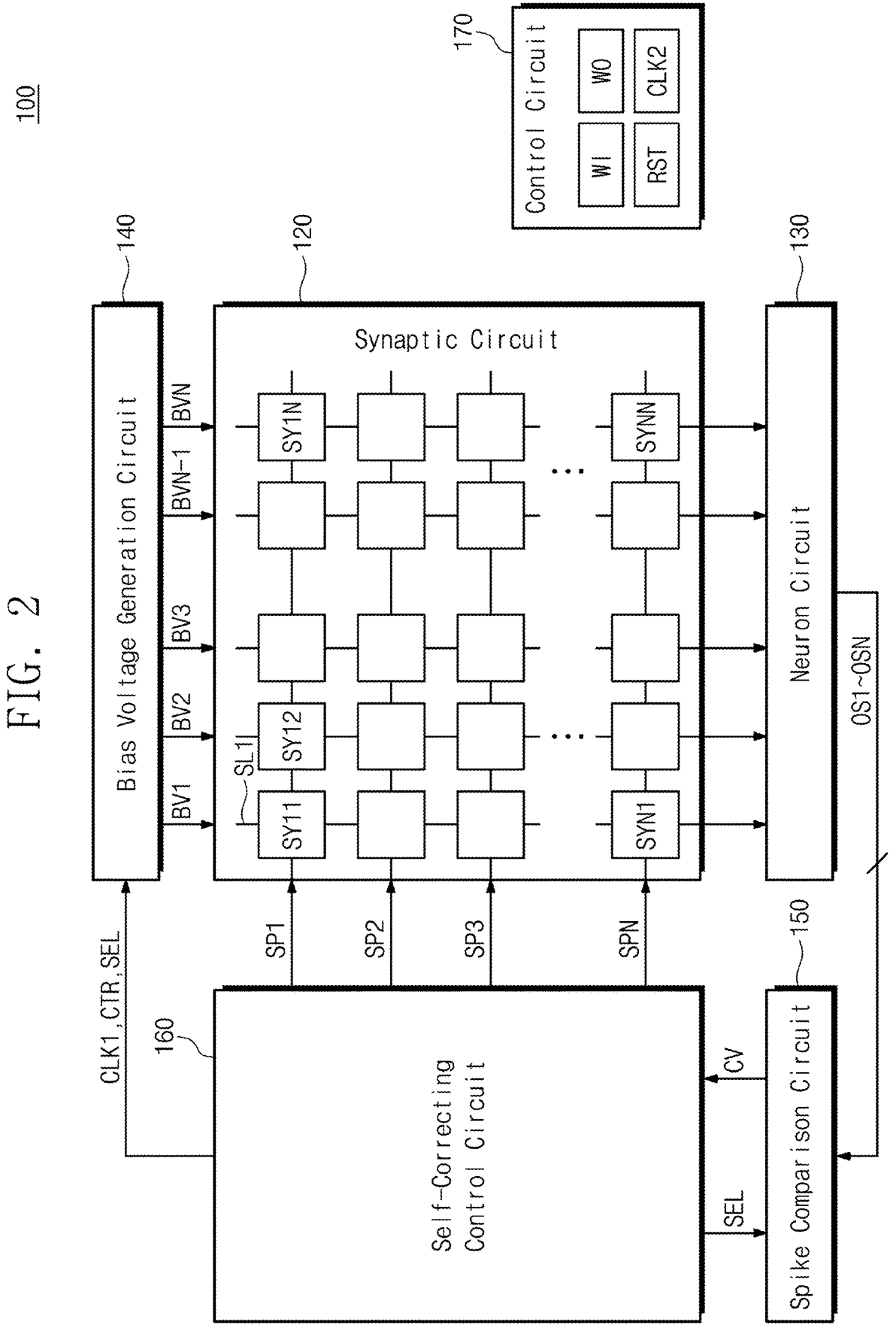
FIG. 2 is a block diagram specifically illustrating a spike neural network circuit according to an embodiment of the present disclosure.

FIG. 2 is a block diagram illustrating a spike neural network circuit according to an embodiment of the present disclosure as an example. Referring to FIG. 2, a spike neural network circuit 100 may include the synaptic circuit 120, the neuron circuit 130, a bias voltage generation circuit 140, a spike comparison circuit 150, a self-correcting control circuit 160, and a control circuit 170. The synaptic circuit 120 and the neuron circuit 130 of FIG. 2 may correspond to the synaptic circuit 120 and the neuron circuit 130 of FIG. 1.

The spike neural network circuit 100 may perform a self-correction operation based on a comparison between an output signal targeted at the time of design and an actual output signal. The self-correction operation may refer to adjusting a bias voltage for the subsequent spike neural network operation, based on a comparison between the output signal targeted in the spike neural network circuit 100 at the time of design and the actual output signal.

In an embodiment, the spike neural network circuit 100 may correct the bias voltage corresponding to the plurality of synaptic columns based on the comparison of the number of pulses of the first to N-th output signals OS1 to OSN with the reference number. The reference number may indicate the number of pulses targeted at the time of design. For example, the spike neural network circuit 100 may compare the number of pulses of the first output signal OS1 with the reference number, and may increase or decrease the bias voltage for the subsequent spike neural network operation depending on the result of the comparison, or may maintain the bias voltage of the previous operation.

The bias voltage generation circuit 140 may generate first to N-th bias voltages BV1 to BVN based on a control code CTR, a selection code SEL, and a first clock CLK1. The first to N-th bias voltages BV1 to BVN may be voltages required for the operation of the plurality of synapses SY11 to SYNN.

Each of the first to N-th bias voltages BV1 to BVN may correspond to first to N-th synaptic columns. The first to N-th bias voltages BV1 to BVN may have different magnitudes from one another. For example, the magnitude of the first bias voltage BV1 may be greater than the magnitude of the second bias voltage BV2.

The bias voltage generation circuit 140 may select one of the first to N-th synaptic columns based on the first clock CLK1 and the selection code SEL. The bias voltage generation circuit 140 may generate a bias voltage corresponding to a selected synaptic column based on the control code CTR. That is, the spike neural network circuit 100 may adjust the first to N-th bias voltages BV1 to BVN based on the control code CTR and the selection code SEL. Accordingly, the spike neural network circuit 100 may adjust the first to N-th bias voltages BV1 to BVN by correcting the control code CTR. A more detailed description of the bias voltage generation circuit 140 will be described later with reference to FIGS. 4 and 5.

The spike comparison circuit 150 may generate a count signal of an output signal selected based on the first to N-th output signals OS1 to OSN and the selection code SEL. The count signal may indicate the number of pulses of the selected output signal. In an embodiment, when the selection code SEL points to the first output signal OS1, the spike comparison circuit 150 may generate a count signal indicating the number of pulses of the first output signal OS1.

The spike comparison circuit 150 may generate a comparison signal CV based on the count signal and the reference number. The comparison signal CV may be used to generate the control code CTR for the subsequent operation of the spike neural network circuit 100. A more detailed description of the spike comparison circuit 150 will be described later with reference to FIGS. 10 and 11.

The self-correcting control circuit 160 may generate signals necessary for the self-correction operation of the spike neural network circuit 100. The self-correcting control circuit 160 may generate first to N-th input signals SP1 to SPN. The input signals SP1 to SPN may be pulse signals that toggle for a short time. The self-correcting control circuit 160 may generate the input signals SP1 to SPN and may transmit them to the synaptic circuit 120.

The self-correcting control circuit 160 may generate the control code CTR, the selection code SEL, and the first clock CLK1. The self-correcting control circuit 160 may receive (feedback) the output signals OS1 to OSN output from the neuron circuit 130 and may generate a control code for the subsequent operation based on the output signals OS1 to OSN.

The self-correcting control circuit 160 may generate a control code for a subsequent operation based on the control code CTR and the comparison signal CV. In an embodiment, the self-correcting control circuit 160 may generate the control code for the subsequent operation by adding the control code CTR and the comparison signal CV. The control code for the subsequent operation may correct the first to N-th bias voltages BV1 to BVN.

In one embodiment, when the selection code SEL points to the first synaptic column, the self-correcting control circuit 160 may generate a control code for correcting the first bias voltage BV1 based on the first control code CTR and the comparison signal CV.

In one embodiment, when the self-correcting control circuit 160 receives the comparison signal CV indicating that the count signal of the first output signal OS1 and the reference number are the same, the self-correcting control circuit 160 may terminate the self-correction operation for the first synaptic column. When the self-correction operation for the first synaptic column is completed, the self-correcting control circuit 160 may perform the self-correction operation for the second synaptic column.

The control circuit 170 may generate signals necessary for the operation of the spike neural network circuit 100. The control circuit 170 may generate a weight input WI, a weight output WO, a reset signal RST, and a second clock CLK2. A weight input WI may include information on weights of each of the plurality of synapses SY11 to SYNN.

The weight output WO may be a signal capable of confirming whether each of the plurality of synapses SY11 to SYNN includes information about the weight. For example, when the weight output WO indicates '1', it may be determined that each of the plurality of synapses SY11 to SYNN includes the information about the weight.

The reset signal RST may be a signal for initialization of circuits of the spike neural network circuit 100. The second clock CLK2 may be a signal for controlling operations of circuits of the spike neural network circuit 100.

Figure 3:
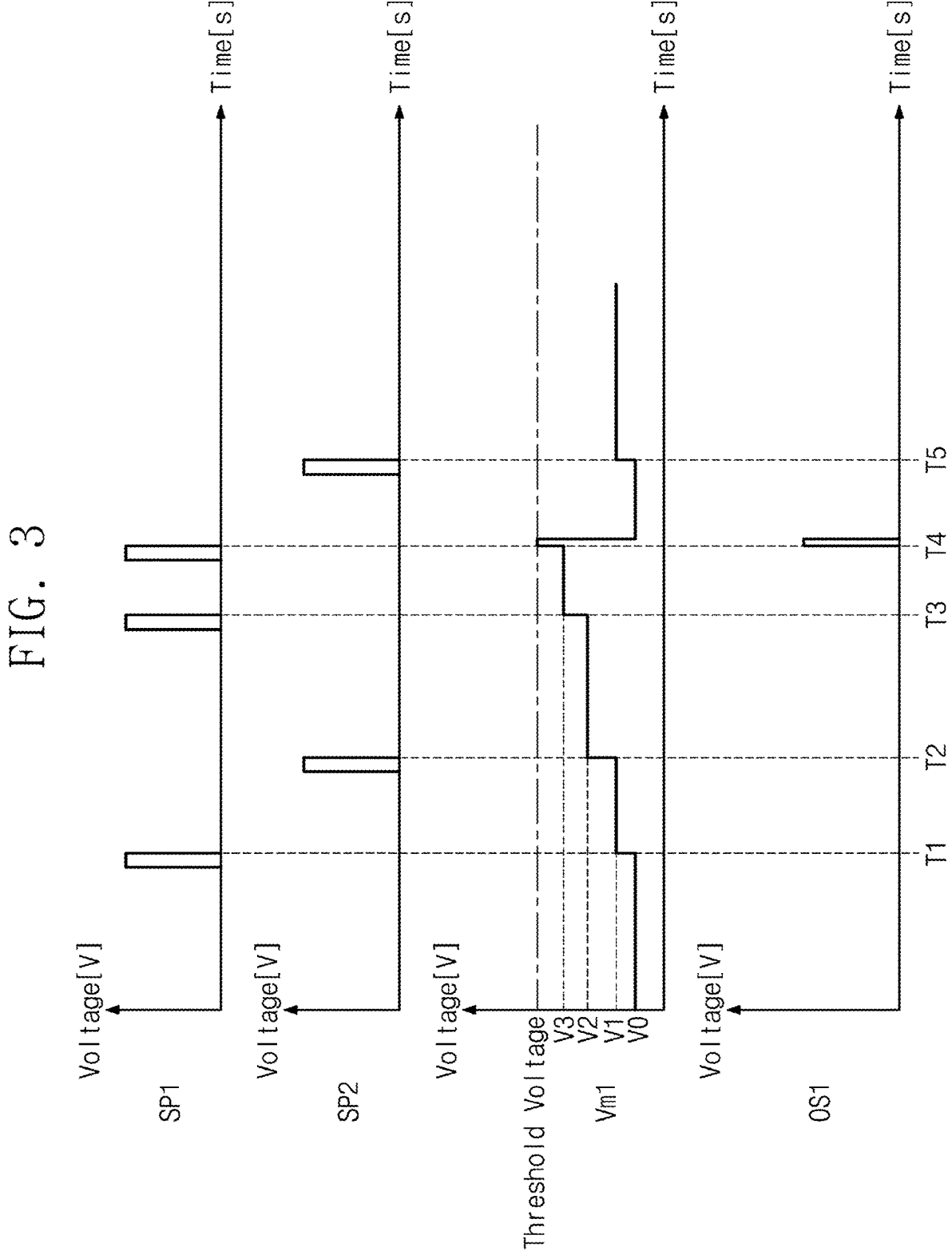
FIG. 3 is a diagram specifically illustrating an output signal according to an embodiment of the present disclosure.

FIG. 3 is a graph specifically illustrating an output signal according to an embodiment of the present disclosure. Referring to FIGS. 1 to 3, the first output signal OS1 generated based on the first input signal SP1 and the second input signal SP2 is illustrated.

At a first time T1, in response to the first input signal SP1, the first synapse SY11 of the first synaptic column may be turned on. Accordingly, the first synapse SY11 may output a first operation signal based on the first input signal SP1 and the weight of the first synapse SY11. Charges corresponding to the first operation signal may be charged in a first capacitor Cm1. Accordingly, a level of the voltage of the first capacitor Cm1 may increase to a first voltage V1.

At a second time T2, similarly to the first time T1, in response to the second input signal SP2, a second synapse (not illustrated) of the first synaptic column may be turned on. Accordingly, the second synapse may output a second operation signal based on the second input signal SP2 and the weight of the second synapse. Charges corresponding to the second operation signal may be charged in the first capacitor Cm1. Accordingly, a level of the voltage of the first capacitor Cm1 may increase to a second voltage V2.

Magnitudes of the increased voltage level in the first capacitor Cm1 may be different depending on the weight of the synapse. For example, when the weight of the first synapse SY11 is greater than the weight of the second synapse, a difference between the first voltage V1 and a discharge voltage V0 may be greater than a difference between the second voltage V2 and the first voltage V1.

At a third time T3, similarly to the first time T1, in response to the first input signal SP1, the first synapse SY11 of the first synaptic column may be turned on. Accordingly, the first synapse may output a third operation signal based on the first input signal SP1 and the weight of the first synapse SY11. Charges corresponding to the third operation signal may be charged in the first capacitor Cm1. Accordingly, a level of the voltage of the first capacitor Cm1 may increase to a third voltage V3.

At a fourth time T4, similarly to the first time T1, in response to the first input signal SP1, the first synapse SY11 of the first synaptic column may be turned on. Accordingly, the first synapse may output a fourth operation signal based on the first input signal SP1 and the weight of the first synapse SY11. Charges corresponding to the fourth operation signal may be charged in the first capacitor Cm1. Accordingly, a level of the voltage of the first capacitor Cm1 may increase to the threshold voltage.

A neuron 131 may generate a pulse in response that the level of the voltage of the first capacitor Cm1 reaches the threshold voltage (i.e., the neuron 131 may fire). Thereafter, the first capacitor Cm1 may be discharged to a discharge voltage V0 close to a ground voltage.

Figure 4:
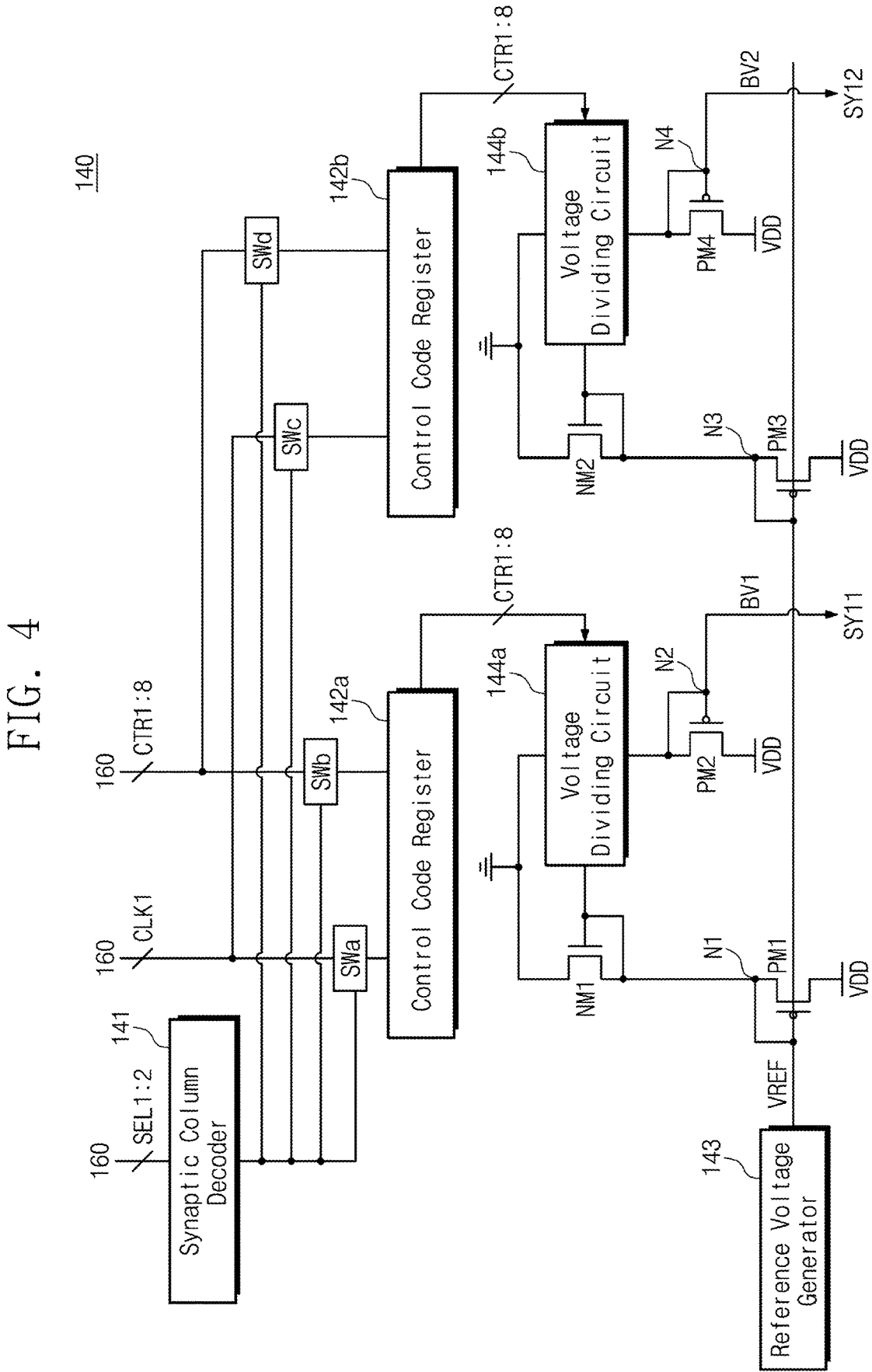
FIG. 4 is a diagram specifically illustrating a bias voltage generation circuit according to an embodiment of the present disclosure.

FIG. 4 is a diagram specifically illustrating a bias voltage generation circuit according to an embodiment of the present disclosure. Referring to FIG. 4, the bias voltage generation circuit 140 may include a synaptic column decoder 141, a control code register 142a, a voltage dividing circuit 144a, and a reference voltage generator 143.

The bias voltage generation circuit 140 may generate the first to N-th bias voltages BV1 to BVN based on a reference voltage VREF and a control code CTR1:8. In an embodiment, the bias voltage generation circuit 140 may generate a bias voltage of a synaptic column selected by a selection code SEL1:2.

The synaptic column decoder 141 may output the control code CTR1:8 and the first clock CLK1 to the control code register 142 of the synaptic column corresponding to the selection code SEL1:2. In an embodiment, the synaptic column decoder 141 may turn on a first switch SWa and a second switch SWb corresponding to the first synaptic column based on the selection code SELL Accordingly, the control code register 142a corresponding to the first synaptic column may receive the first clock CLK1 and the control code CTR1:8. That is, the bias voltage generation circuit 140 may generate a bias voltage associated with the first synaptic column.

In an embodiment, the synaptic column decoder 141 may turn on a third switch SWc and a fourth switch SWd corresponding to a second synaptic column based on the selection code SEL2. Accordingly, a control code register 142b corresponding to the second synaptic column may receive the first clock CLK1 and the control code CTR1:8. That is, the bias voltage generation circuit 140 may generate a bias voltage associated with the second synaptic column.

The control code register 142 may store the control code CTR1:8. The control code CTR1:8 may be a signal including a plurality of bits. For example, the control code CTR1:8 may include 8 bits.

The control code register 142 may output the control code CTR1:8 to the voltage dividing circuit 144 based on the first clock CLK1. In an embodiment, the control code register 142a may output the control code CTR1:8 to the voltage dividing circuit 144a based on the first clock CLK1. In an embodiment, the control code register 142b may output the control code CTR1:8 to a voltage dividing circuit 144b based on the first clock CLK1.

The reference voltage generator 143 may generate a reference voltage VREF. The bias voltage generation circuit 140 may generate the first to N-th bias voltages BV1 to BVN based on the reference voltage VREF. The reference voltage generator 143 may be connected to a first NMOS transistor NM1 and a first PMOS transistor PM1 through a first node N1. The reference voltage generator 143 may output the reference voltage VREF to the first node N1.

The voltage dividing circuit 144a may generate the first bias voltage BV1 based on the control code CTR1:8 and the reference voltage VREF. The voltage dividing circuit 144a may receive the reference voltage VREF from the reference voltage generator 143 through the first NMOS transistor NM1 and the first PMOS transistor PM1.

The voltage dividing circuit 144a may output the first bias voltage BV1 to the first synapse SY11 through a second PMOS transistor PM2. A more detailed description of the voltage dividing circuit 144a will be described later with reference to FIG. 5.

The first NMOS transistor NM1 may be connected between the first node N1 connected to the reference voltage generator 143 and the ground node that receives the ground voltage, and may operate in response to the reference voltage VREF. The first PMOS transistor PM1 may be connected between the first node N1 connected to the first NMOS transistor NM1 and a power node receiving the power supply voltage VDD, and may operate in response to the reference voltage VREF. The second PMOS transistor PM2 may be connected between a second node N2 connected to the voltage dividing circuit 144a and the power node receiving the power supply voltage VDD, and may operate in response to the first bias voltage BV1.

The voltage dividing circuit 144b may generate the second bias voltage BV2 based on the control code CTR1:8 and the reference voltage VREF. The voltage dividing circuit 144b may receive the reference voltage VREF from the reference voltage generator 143 through a second NMOS transistor NM2 and a fourth PMOS transistor PM4. The voltage dividing circuit 144b may output the second bias voltage BV2 to the second synapse SY12 through a third PMOS transistor PM3.

The second NMOS transistor NM2 may be connected between a third node N3 connected to the reference voltage generator 143 and the ground node receiving the ground voltage, and may operate in response to the reference voltage VREF. The third PMOS transistor PM3 may be connected between the third node N3 connected to the second NMOS transistor NM2 and the power node receiving the power supply voltage VDD, and may operate in response to the reference voltage VREF. The fourth PMOS transistor PM4 may be connected between a fourth node N4 connected to the voltage dividing circuit 144a and the power node receiving the power supply voltage VDD, and may operate in response to the second bias voltage BV2.

Although only the operation of generating the first bias voltage BV1 of the first synaptic column and the second bias voltage BV2 of the second synaptic column is described, the bias voltage generation circuit 140 may generate third to N-th bias voltages BV3 to BVN of the third to N-th synaptic columns similarly to the first synaptic column and the second synaptic column.

Figure 5:
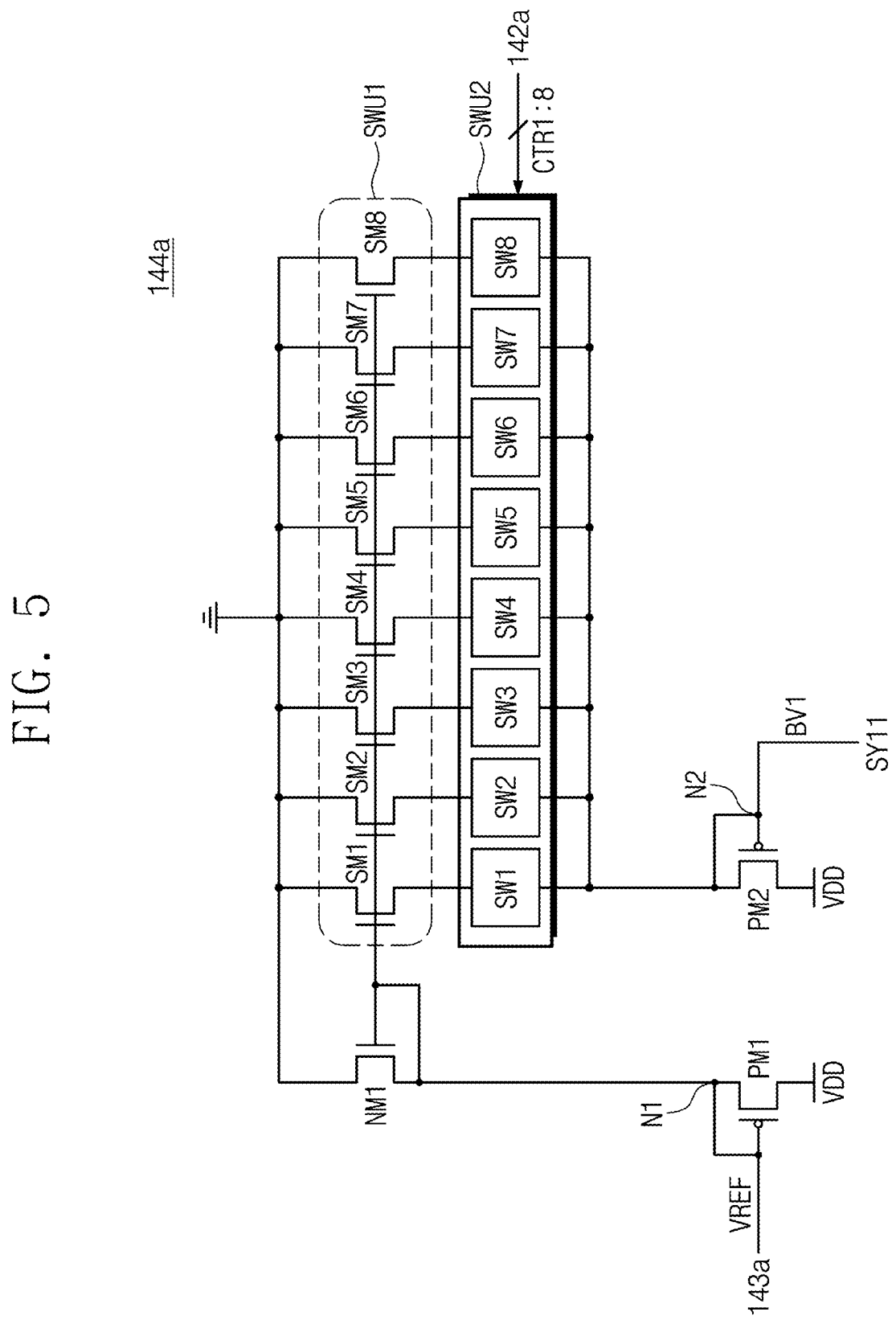
FIG. 5 is a diagram specifically illustrating a voltage dividing circuit according to an embodiment of the present disclosure.

FIG. 5 is a diagram specifically illustrating a voltage dividing circuit according to an embodiment of the present disclosure. Referring to FIG. 5, the voltage dividing circuit 144a may include a first switch unit SWU1 and a second switch unit SWU2.

The first switch unit SWU1 may be connected between the ground node receiving the ground voltage and the second switch unit SWU2. The first switch unit SWU1 may operate in response to the reference voltage VREF generated by a reference voltage generator 143a. The first switch unit SWU1 may be connected to the reference voltage generator 143a through the first NMOS transistor NM1 and the first PMOS transistor PM1.

The first switch unit SWU1 may include a plurality of transistors SM1 to SM8. In an embodiment, each of the plurality of transistors SM1 to SM8 in the first switch unit SWU1 may be an NMOS transistor. In an embodiment, widths of each of the plurality of transistors SM1 to SM8 in the first switch unit SWU1 may be different from one another.

In an embodiment, the widths of each of the plurality of transistors SM1 to SM8 may be a multiple of a power of two. For example, the width of the second transistor SM2 may be twice the width of the first transistor SM1. The width of the third transistor SM3 may be four times the width of the first transistor SM1. The width of the fourth transistor SM4 may be eight times the width of the first transistor SM1. The width of the fifth transistor SM5 may be 16 times the width of the first transistor SM1. The width of the sixth transistor SM6 may be 32 times the width of the first transistor SM1. The width of the seventh transistor SM7 may be 64 times the width of the first transistor SM1. The width of the eighth transistor SM8 may be 128 times the width of the first transistor SM1.

Each of the plurality of transistors SM1 to SM8 in the first switch unit SWU1 may operate in response to the reference voltage VREF. In an embodiment, each of the plurality of transistors SM1 to SM8 may be turned on based on the reference voltage VREF. Accordingly, the first bias voltage BV1 may be generated based on the reference voltage VREF and the widths of the plurality of transistors SM1 to SM8.

The second switch unit SWU2 may be connected between the first switch unit SWU1 and the second node N2. The second switch unit SWU2 may be connected to the first synapse SY11 through the second PMOS transistor PM2.

The second switch unit SWU2 may include the plurality of switches SW1 to SW8. In an embodiment, the second switch unit SWU2 may include eight transistors. Each Switch of the second switch unit SWU2 may be turned on based on the control code CTR1:8.

In an embodiment, when the control code CTR1:8 is the signal for turning on the first switch SW1, based on the reference voltage VREF, the first transistor SM1, and the first switch SW1, the first bias voltage BV1 may be generated.

For example, when the first switch SW1 is turned on by the control code CTR1:8, the voltage dividing circuit 144a may generate the first bias voltage BV1 whose magnitude is proportional to the width of the first transistor SM1. When the second switch SW2 is turned on by the control code CTR1:8, the voltage dividing circuit 144a may generate the first bias voltage BV1 whose magnitude is proportional to the width of the second transistor SM2.

That is, the voltage dividing circuit 144 may adjust the magnitudes of the first to N-th bias voltages BV1 to BVN based on the control code CTR1:8. For example, when the control code received to the first synaptic column is different from the control code received to the second synaptic column, the magnitude of the first bias voltage BV1 may be different from the magnitude of the second bias voltage BV2.

Although FIG. 5 illustrates the voltage division operation of the voltage dividing circuit 144a of the first synaptic column, but the voltage dividing circuits of the second to N-th synaptic columns may operate similarly to the voltage dividing circuit 144a.

Figure 6:
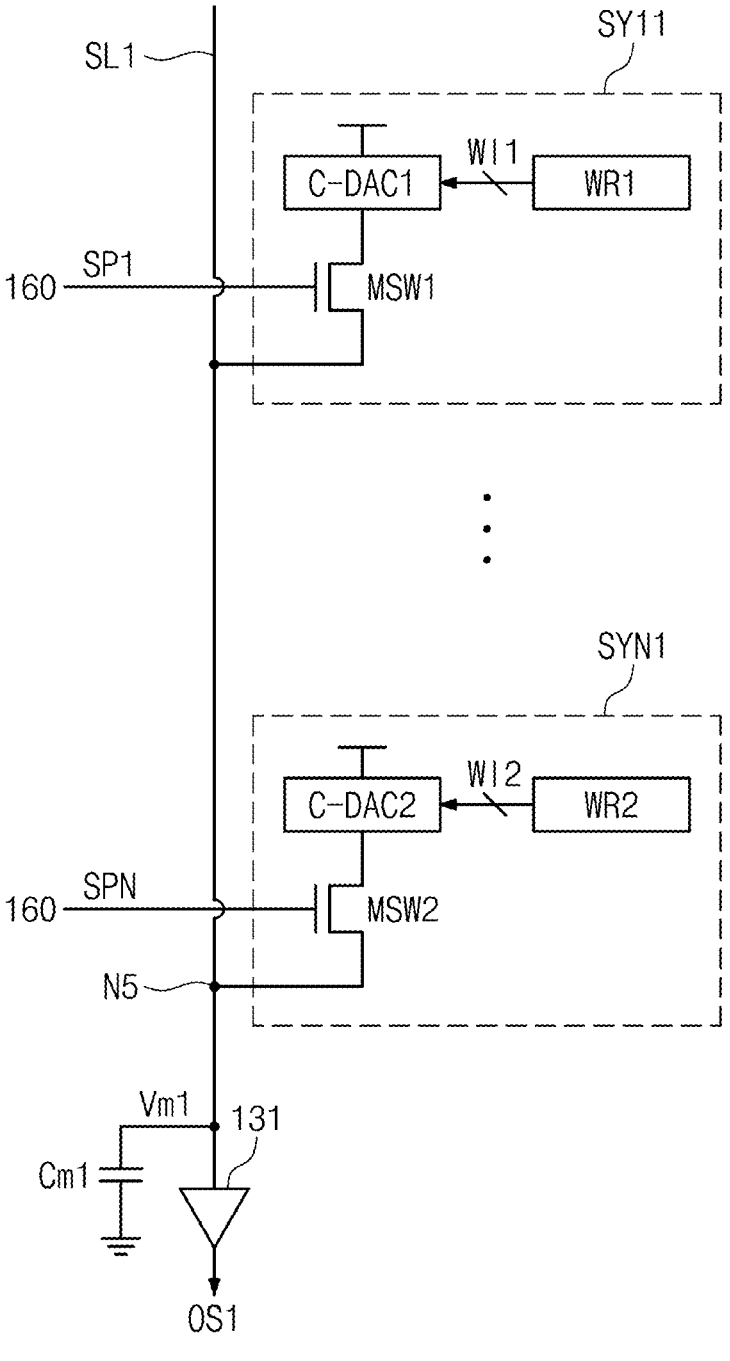
FIG. 6 is a diagram specifically illustrating a synaptic column according to an embodiment of the present disclosure.

FIG. 6 is a diagram specifically illustrating a synaptic column according to an embodiment of the present disclosure. Referring to FIG. 6, a first synaptic column may include a first transmission line SL1, the first capacitor Cm1, and the plurality of synapses SY11 to SYN1.

The first to N-th synapses SY11 to SYN1 may be connected to a first neuron 131 through the first transmission line SL1. The first to N-th synapses SY11 to SYN1 and the first capacitor Cm1 may be connected to the first transmission line SL1 through a fifth node N5.

The first synapse SY11 may receive the first input signal SP1 from the self-correcting control circuit 160. The second synapse (not illustrated) may receive a second input signal from the self-correcting control circuit 160. The N-th synapse SYN1 may receive an N-th input signal SPN from the self-correcting control circuit 160.

Each of the first to N-th synapses SY11 to SYN1 may include a converter circuit, a transistor MSW, and a weight register WR. The first synapse SY11 may include a first converter circuit C-DAC1, a first synaptic transistor MSW1, and a first weight register WR1. The N-th synapse SYN1 may include a second converter circuit C-DAC2, a second synaptic transistor MSW2, and a second weight register WR2. A more detailed description of the First to N-th synapses SY11 to SYN1 will be described later with reference to FIG. 7.

The first synapse SY11 may generate a first operation signal based on a weight WI1 of the first synapse SY11 and the first input signal SP1. The first synapse SY11 may output the first operation signal to the first transmission line SL1. The N-th synapse SYN1 may generate a second operation signal based on a weight WI2 of the N-th synapse SYN1 and the N-th input signal SPN. The N-th synapse SYN1 may output the second operation signal to the first transmission line SL1.

The first capacitor Cm1 may be charged by the first operation signal output from the first synapse SY11. The first capacitor Cm1 may be charged by the second operation signal output from the N-th synapse SYN1.

The neuron circuit 130 may include the first capacitor Cm1 and the first neuron 131 connected to the first to N-th synapses SY11 to SYN1. The first capacitor Cm1 may be charged by operation signals output from the first to N-th synapses SY11 to SYN1. The level of a voltage Vm1 of the first capacitor Cm1 may correspond to the amount of charge accumulated depending on the operation signals output from the first to N-th synapses SY11 to SYN1. The voltage Vm1 of the first capacitor Cm1 may be provided to the first neuron 131.

The first neuron 131 may compare the magnitude of the operation signals output from the first to N-th synapses SY11 to SYN1 and a threshold voltage. For example, the first neuron 131 may compare the voltage Vm1 of the first capacitor Cm1 with the threshold voltage. The first neuron 131 may generate the output signal OS1 based on the comparison result. In an embodiment, when the voltage Vm1 of the first capacitor Cm1 is greater than the threshold voltage, the first neuron 131 may generate a pulse.

Figure 7:
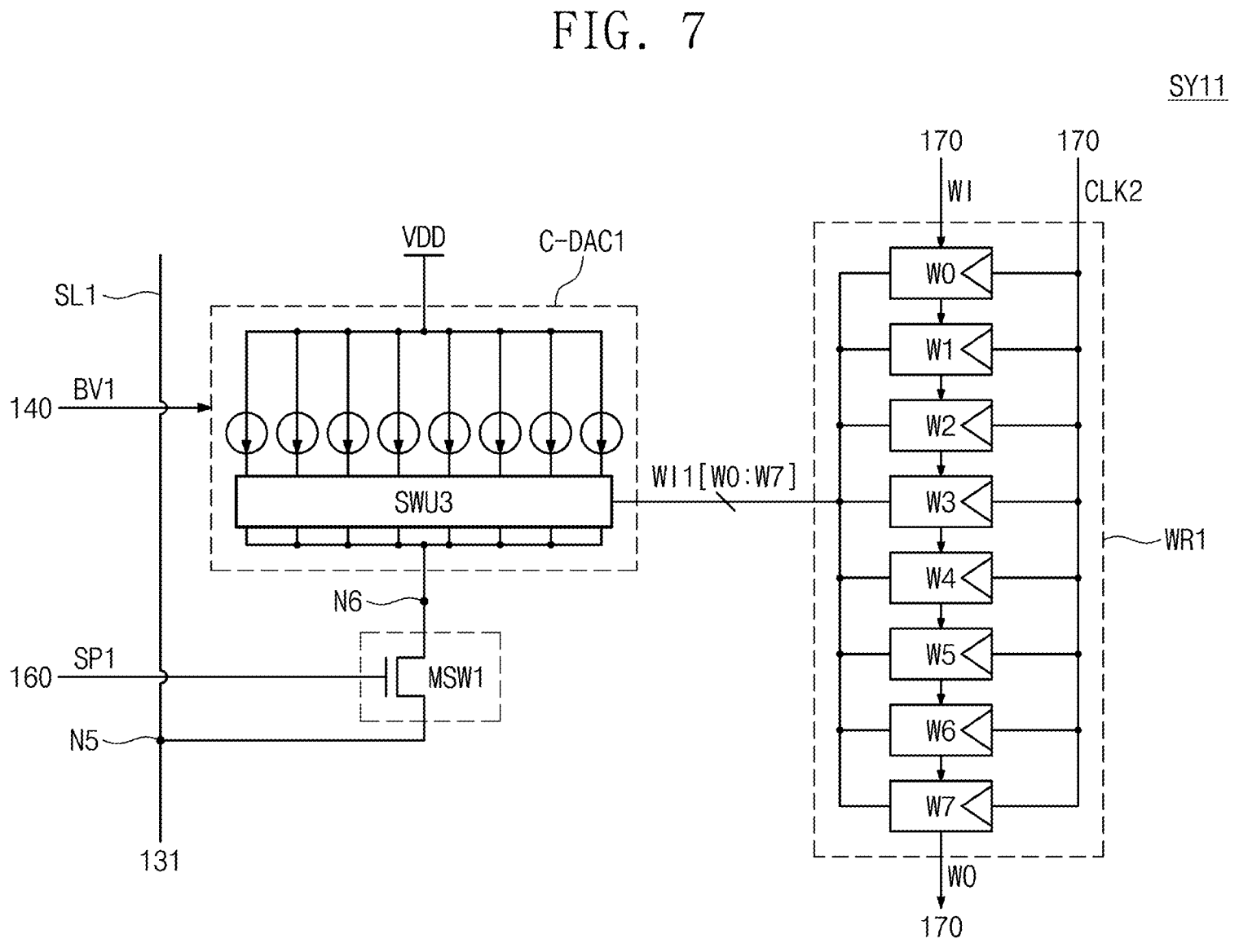

FIG. 7 is a diagram specifically illustrating a synapse according to an embodiment of the present disclosure. Referring to FIG. 7, the first synapse SY11 may include the first converter circuit C-DAC1, the first weight register WR1, and the first synaptic transistor MSW1.

The first synapse SY11 may generate the first operation signal based on the first input signal SP1 and the first weight WI1. The magnitude of the first operation signal may be determined by the product of the first input signal SP1 and the first weight WI1. For example, the first operation signal may be a current signal corresponding to the product of the first input signal SP1 and the first weight WI1.

A first weight register WM1 may store information on the weight WI1 of the first synapse SY11 based on the weight input WI and the second clock CLK2. In an embodiment, the first weight register WM1 may store the first weight WI1 corresponding to the first synapse SY11 among the weight inputs WI based on the second clock CLK2. The first weight register WM1 may store bits W0:W7 corresponding to the first weight WI1. In some embodiments, the first weight register WM1 may include a register or a memory cell, a latch, a NAND flash memory cell, etc.

The first weight register WM1 may provide a digital signal W0:W7 corresponding to the weight WI1 of the first synapse SY11 to the first converter circuit C-DAC1.

The plurality of bits W0:W7 stored in the first weight register WR1 may be converted to an analog signal (e.g., a voltage or current signal) corresponding to the first weight WI1 by the first converter circuit C-DAC1 of the first synapse SY11.

The first weight register WR1 may output a weight output WO when the plurality of bits W0:W7 corresponding to the first weight WI1 are stored. That is, through the weight output WO, it may be confirmed whether information on the weight corresponding to the first synapse SY11 is stored in the first weight register WR1.

The first converter circuit C-DAC1 may generate a current corresponding to the weight WI1 of the first synapse SY11. In some embodiments, the first converter circuit C-DAC1 may include a plurality of current sources and a third switch unit SWU3, which are connected between a power node receiving the power supply voltage VDD and the first synaptic transistor MSW1.

The plurality of current sources may be connected between the power node receiving the power voltage VDD and the third switch unit SWU3. In an embodiment, the plurality of current sources may generate currents having different magnitudes. In an embodiment, the plurality of current sources may generate the currents such that the magnitude of the current increases by a multiple of a power of two. For example, the magnitude of the current generated by a second current source may be twice the magnitude of the current generated by a first current source. The magnitude of the current generated by a third current source may be four times the magnitude of the current generated by the first current source.

In an embodiment, the plurality of current sources may generate the currents based on the first bias voltage BV1. That is, the magnitude of the first bias voltage BV1 may be proportional to the magnitude of the current generated by each of the plurality of current sources.

The third switch unit SWU3 may receive the digital signal W0:W7 corresponding to the first weight WI1 from the first weight register WR1. In an embodiment, the third switch unit SWU3 may include a plurality of transistors (e.g., PMOS transistors).

The third switch unit SWU3 may be connected between the plurality of current sources and a sixth node N6 connected to the first synaptic transistor MSW1. The third switch unit SWU3 may output a current corresponding to the weight WI1 to the first synaptic transistor MSW1. That is, the current output from the first converter circuit C-DAC1 may correspond to the operation result of the first synapse SY11.

The first synaptic transistor MSW1 may be connected between the sixth node N6 connected to the third switch unit SWU3 and the fifth node N5 connected to the transmission line SL1. The first synaptic transistor MSW1 may receive the first input signal SP1 through the gate terminal. The first synaptic transistor MSW1 may be turned on based on the first input signal SP1. When the first synaptic transistor MSW1 is turned on in response to the first input signal SP1, the first synaptic transistor MSW1 may output the current output from the first converter circuit C-DAC1 depending on the first input signal SP1, that is, the first operation signal to the first transmission line SL1. In some embodiments, the first synaptic transistor MSW1 may be implemented with a PMOS transistor, an NMOS transistor, or a combination of PMOS and NMOS transistors.

In detail, when the first synapse transistor MSW1 is turned on as the first input signal SP1 is applied to the first synapse SY11, the first converter circuit C-DAC1 may transfer charges corresponding to the magnitude of the current source corresponding to the weight stored in the first weight register WR1 to the neuron 131 through the first transmission line SL1.

FIG. 7 illustrates the first converter C-DAC1 including 8 current sources and the weight register WR1 including 8 bits, but the present disclosure is not limited thereto, and the number of current sources and the number of bits may increase or decrease.

Figure 8:
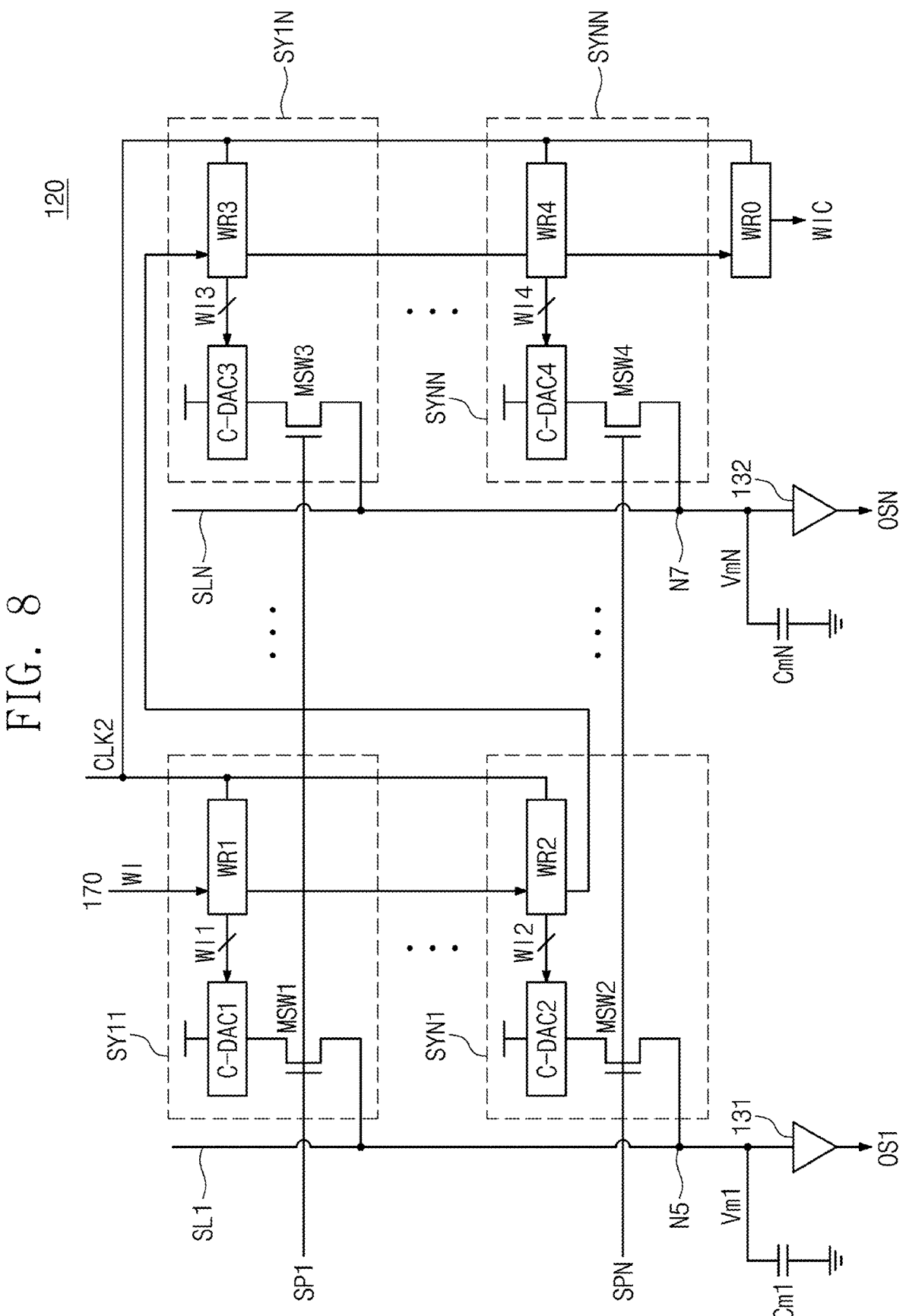
FIG. 8 is a diagram specifically illustrating a synaptic circuit according to an embodiment of the present disclosure.

FIG. 8 is a diagram specifically illustrating a synaptic circuit according to an embodiment of the present disclosure. Referring to FIGS. 7 and 8, the synaptic circuit 120 including the plurality of synapses SY11 to SYNN is illustrated. Each of the plurality of synapses SY11 to SYNN may correspond to the synapse SY11 of FIG. 7.

The synaptic circuit 120 may include the plurality of synapses SY11 to SYNN. Each of the plurality of synapses SY11 to SYNN may include a converter circuit and a weight register.

The synaptic circuit 120 may include a plurality of synaptic columns. Each of the plurality of synaptic columns may correspond to the first synaptic column of FIG. 6. The N-th synaptic column may include an N-th transmission line SLN, an N-th capacitor CmN, and a plurality of synapses SY1N to SYNN. Each of the plurality of synapses SY1N to SYNN may be connected to the N-th transmission line SLN through a seventh node N7. The operation signals of each of the plurality of synapses SY1N to SYNN may be transferred to an N-th neuron 132 through the N-th transmission line SLN. The N-th neuron 132 may fire based on the level of a voltage VmN of the N-th capacitor CmN.

The synaptic circuit 120 may include an output weight register WRO. The output weight register WRO may output a weight input completion signal WIC. The weight input completion signal WIC may indicate whether a weight is input to the weight register of the plurality of synapses SY11 to SYNN of the synaptic circuit 120. In an embodiment, when a weight is input to the weight register WRO, the weight input completion signal WIC may be '1'.

FIG. 9 is a diagram specifically illustrating a weight input according to an embodiment of the present disclosure. Referring to FIGS. 8 and 9, the weight input WI to be input to the weight register of each of the plurality of synapses SY11 to SYNN is illustrated.

The weight input WI may include weights to be input to weight registers corresponding to the plurality of synapses SY11 to SYNN. In an embodiment, based on the second clock, the weight input WI may be sequentially input to weight registers corresponding to the plurality of synapses SY11 to SYNN.

As an embodiment, the first input signal among input signals may be input to the output weight register WRO as a pilot signal PS. The pilot signal PS may be a signal confirming whether the weight input WI is stored in the weight register of each of the plurality of synapses SY11 to SYNN.

The second input signal may be a fourth weight WI4 corresponding to the N-th synapse SYNN located at the lower right of the synaptic circuit 120. The fourth weight WI4 may be input to the fourth weight register WR4 of the N-th synapse SYNN.

An M-th input signal may be the first weight WI1 corresponding to the first synapse SY11 located at the upper left of the synaptic circuit 120. The first weight WI1 may be input to the first weight register WR1 of the first synapse SY11.

For example, when 'FF' is input to the output weight register WRO as the pilot signal PS, the output weight register WRO may output the weight input completion signal WIC. '00' may be input to the fourth weight register WR4 of the N-th synapse SYNN as the first weight WI1. 'OA' may be input to the first weight register WR1 of the first synapse SY11 as the fourth weight WI4.

Although FIG. 9 illustrates that the weight input WI is sequentially input from the synapse located at the lower right to the synapse located at the upper left, the order in which the weight input WI is input may be changed depending on the connection order of the synaptic registers of the plurality of synapses SY11 to SYNN.

Figure 10:
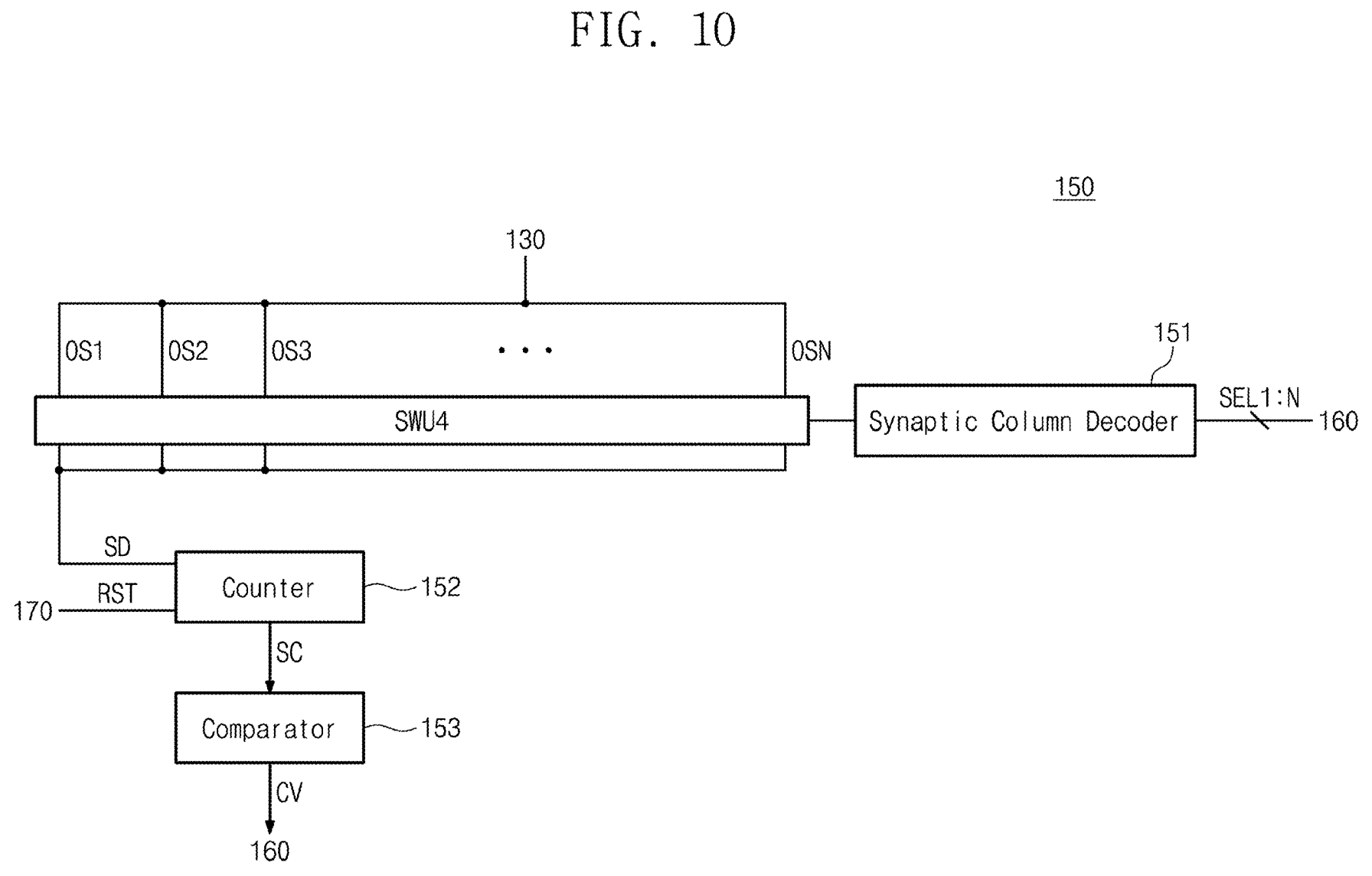

FIG. 10 is a diagram specifically illustrating a spike comparison circuit according to an embodiment of the present disclosure. Referring to FIG. 10, the spike comparison circuit 150 may include a synaptic column decoder 151, a fourth switch unit SWU4, a counter 152, and a comparator 153.

The synaptic column decoder 151 may turn on switches of the fourth switch unit SWU4 based on a selection code SEL1:N. In an embodiment, the synaptic column decoder 151 may turn on a switch corresponding to the first output signal OS1 based on the selection code SELL The synaptic column decoder 151 may turn on a switch corresponding to the N-th output signal OSN based on the selection code SELN.

The fourth switch unit SWU4 may include a plurality of switches. In an embodiment, the fourth switch unit SWU4 may include N switches.

The counter 152 may generate a count signal SC of a selected output signal SD. The count signal SC may indicate the number of pulses of the selected output signal SD. In one embodiment, when the first output signal OS1 is selected by the synaptic column decoder 151 and the fourth switch unit SWU4, the counter 152 may generate the count signal SC based on the number of pulses of the first output signal OS1. A more detailed description of the counter 152 will be described later with reference to FIG. 11.

The comparator 153 may generate a comparison signal based on the count signal SC and the reference number. The reference number may indicate the number of pulses targeted by the spike neural network circuit at the time of design. The count signal SC may actually indicate the number of pulses generated by the spike neural network circuit.

The comparison signal CV may indicate one of a first operation value, a second operation value, and a third operation value based on the comparison between the count signal SC and the reference number. In an embodiment, when the count signal SC is greater than the reference number, the comparison signal CV may indicate the first operation value. For example, the first operation value may be '−1'. When the second control code is generated based on the comparison signal CV indicating the first operation value, the second bias voltage generated based on the second control code may be less than the first bias voltage generated based on the first control code.

In an embodiment, when the count signal SC is less than the reference number, the comparison signal CV may indicate the second operation value. For example, the second operation value may be '+1'. When the second control code is generated based on the comparison signal CV indicating the second operation value, the second bias voltage generated based on the second control code may be greater than the first bias voltage generated based on the first control code.

In an embodiment, when the count signal SC is equal to the reference number, the comparison signal CV may indicate the third operation value. For example, the third operation value may be '0'. When the second control code is generated based on the comparison signal CV indicating the third operation value, the second bias voltage generated based on the second control code may be the same as the first bias voltage generated based on the first control code.

However, the present disclosure is not limited thereto, and the spike neural network circuit may adjust the size of the operation value depending on the difference between the count signal SC and the reference number. For example, when the reference number is '100' and the count signal SC is '110', the spike neural network circuit may determine the operation value as '−1'. As another example, when the reference number is '100' and the count signal SC is '120', the spike neural network circuit may determine the operation value as '−2'. The determined operation value may be used to determine a bias voltage for the subsequent neural network operation.

That is, the comparator 153 may compare the reference number (e.g., the number of pulses targeted at the time of design) with the number (e.g., the number of pulses actually generated in the spike neural network circuit) of pulses of the output signal, and may generate the comparison signal CV. The comparison signal CV may be used to determine a bias voltage for the subsequent neural network operation. For example, as the comparison signal CV increases or decreases the magnitude of the bias voltage, a difference between the number of pulses of the subsequent output signal and the number of pulses targeted at the time of design may be reduced.

Figure 11:
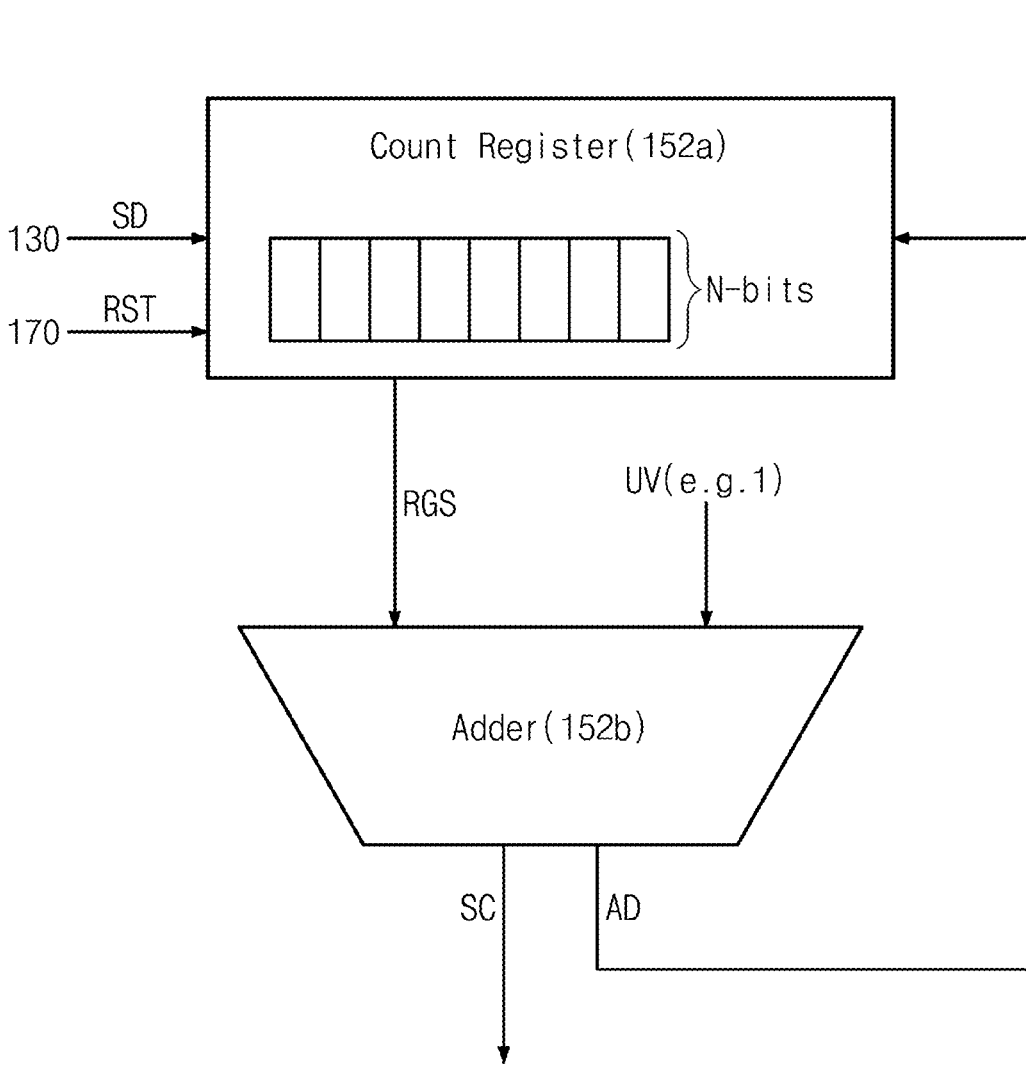
FIG. 11 is a diagram specifically illustrating a counter according to an embodiment of the present disclosure.

FIG. 11 is a diagram specifically illustrating a counter according to an embodiment of the present disclosure. Referring to FIG. 11, the counter 152 is illustrated including a count register 152a and an adder 152b.

The count register 152a may be a register capable of storing a plurality of bits. In an embodiment, the count register 152a may be a register that stores an N-bit register value. The count register 152a may operate based on the selected output signal SD. For example, the selected output signal SD may include a plurality of pulses. The count register 152a may output a register signal RGS to the adder 152b whenever the pulse of the selected output signal SD is input. The register signal RGS may be a signal indicating a register value currently stored in the count register 152a.

The count register 152a may receive the reset signal RST from the control circuit 170. The reset signal RST may reset the count register 152a. For example, when processing of the selected output signal SD corresponding to one synaptic column is completed, the control circuit 170 may reset the count register 152a based on the reset signal RST. The adder 152b may generate the count signal SC and an addition signal AD based on the register signal RGS and a unit value UV. The count signal SC may be a signal indicating the number of pulses of the selected output signal SD. The addition signal AD may be a signal indicating a value obtained by adding the unit value UV to the register value of the register signal RGS. For example, the unit value UV may be '1'. The adder 152b may store the addition signal AD in the count register 152a.

For example, when the selected output signal SD has first and second pulses, the count register 152a may output the register signal RGS indicating '0' to the adder 152b, based on the first pulse. The adder 152b may add the unit value (e.g., '1') to the register signal RGS indicating '0' and may output the addition signal AD indicating '1' to the count register 152a. The count register 152a may output the register signal RGS indicating '1' to the adder 152b, based on the second pulse. The adder 152b may add the unit value (e.g., '1') to the register signal RGS indicating '1' and may output the count signal SC indicating '2' to the comparator 153. Since the second pulse is the last pulse of the selected output signal SD, the register value stored in the count register 152a may be reset based on the reset signal RST.

Figure 12:
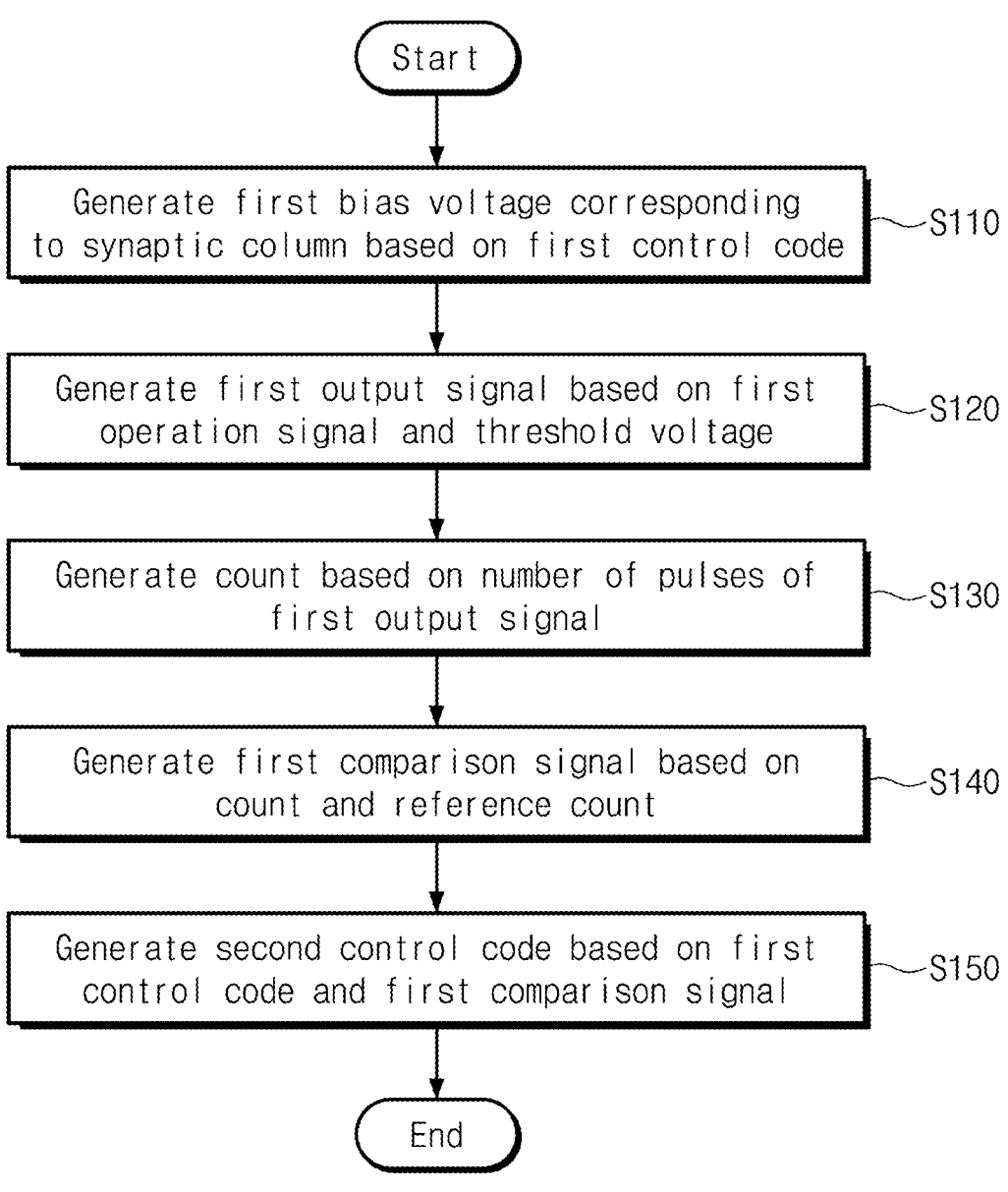
FIG. 12 is a flowchart specifically describing a method of operating a spike neural circuit according to an embodiment of the present disclosure.

FIG. 12 is a flowchart specifically describing a method of operating a spike neural circuit according to an embodiment of the present disclosure. Referring to FIG. 12, an operation method of the spike neural network circuit 100 of FIG. 2 is illustrated. The spike neural network circuit 100 may correct a bias voltage based on the control code.

In operation S110, the spike neural network circuit 100 may generate the first bias voltage BV1 corresponding to a synaptic column based on the first control code. The first bias voltage BV1 may be a voltage required for the operation of the synapses in the synaptic column. In an embodiment, the spike neural network circuit 100 may generate the first bias voltage BV1 corresponding to the first synaptic column among a plurality of synaptic columns based on the first control code.

In operation S120, the spike neural network circuit 100 may generate the first output signal OS1 based on the first operation signal and the threshold voltage. In an embodiment, the spike neural network circuit 100 may output a first operation signal based on the first input signal SP1 and the weight of the first synapse SY11. Charges corresponding to the first operation signal may be charged in a capacitor. Accordingly, the level of the voltage of the capacitor may increase.

The spike neural network circuit 100 may generate the first output signal OS1 based on a comparison between the voltage of the capacitor and the threshold voltage. In an embodiment, the spike neural network circuit 100 may generate a pulse whenever the voltage of the capacitor reaches the threshold voltage.

In operation S130, the spike neural network circuit 100 may generate a count signal based on the number of pulses of the first output signal OS1. The count signal may indicate the number of pulses of the first output signal OS1. For example, when the number of pulses of the first output signal OS1 is 4, the count signal may be '4'.

In operation S140, the spike neural network circuit 100 may generate the first comparison signal CV based on the count signal and the reference number. The reference number may indicate the number of pulses targeted in the spike neural network circuit 100 at the time of design. The first comparison signal CV may be used to generate a second control code for correcting the first bias voltage BV1 of the spike neural network circuit 100. A more detailed description of the operation of generating the first comparison signal CV will be described later with reference to FIG. 13.

In operation S150, the spike neural network circuit 100 may generate the second control code based on the first control code CTR and the first comparison signal CV. In an embodiment, the spike neural network circuit 100 may generate the second control code by summing the first control code CTR and the first comparison signal CV.

The spike neural network circuit 100 may generate the second bias voltage for a subsequent operation based on the second control code. That is, the number of pulses generated by the second bias voltage may be more similar to the reference number than the number of pulses generated by the first bias voltage.

Figure 13:
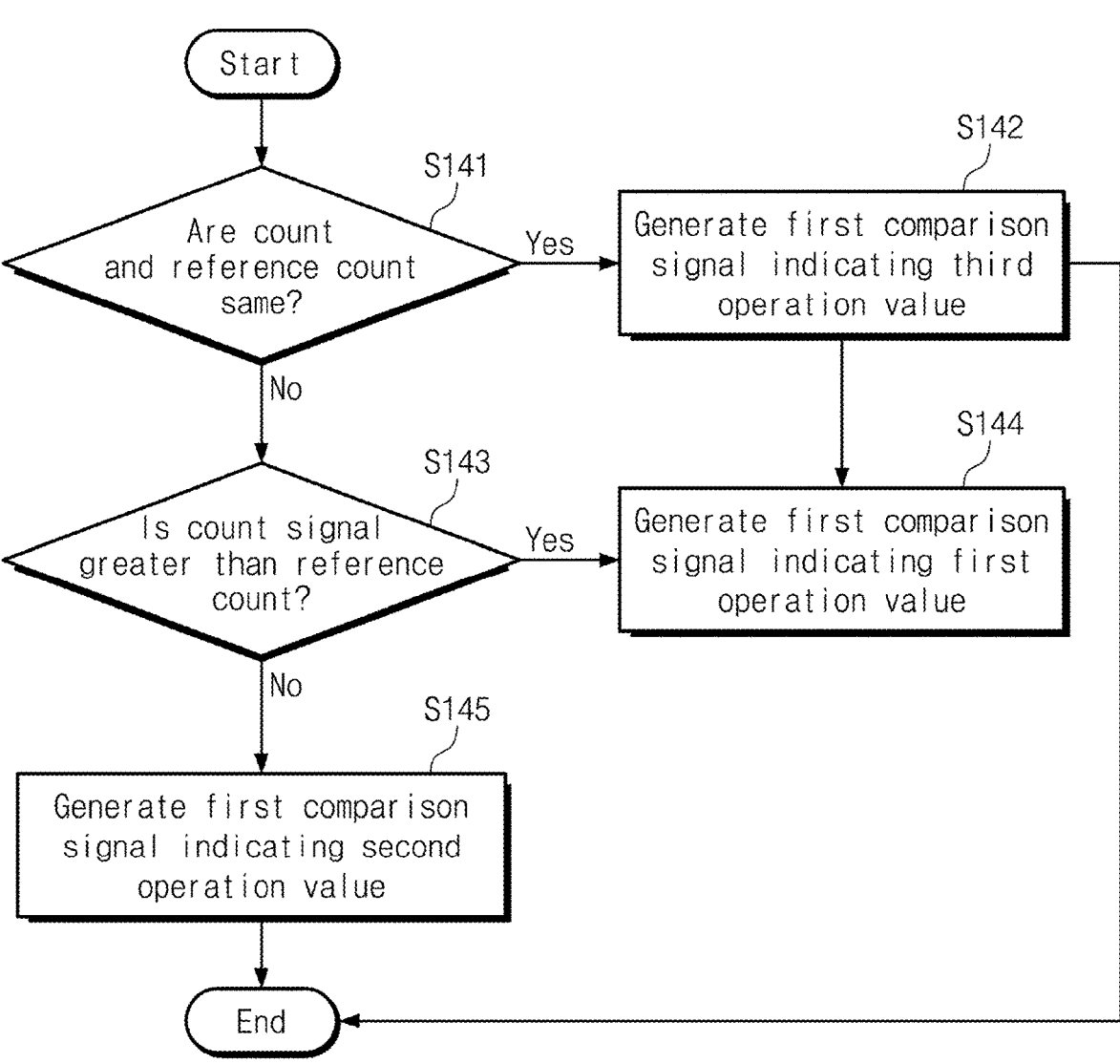
FIG. 13 is a flowchart specifically describing a method of operating a spike neural circuit according to an embodiment of the present disclosure.

FIG. 13 is a flowchart specifically describing a method of operating a spike neural circuit according to an embodiment of the present disclosure. Referring to FIG. 13, an operation of generating the first comparison signal based on a count and the reference number is illustrated. The flowchart of FIG. 13 may be operations embodying operation S140 of the flowchart of FIG. 12.

In operation S141, the spike neural network circuit 100 may determine whether the count and the reference number are the same. When it is determined that the count and the reference number are the same, operation S142 may be performed. When it is determined that the count and the reference number are not the same, operation S143 may be performed.

In operation S142, the spike neural network circuit 100 may generate a first comparison signal indicating a third operation value. For example, the third operation value may indicate '0'. The spike neural network circuit 100 may generate a second bias voltage obtained by correcting the first bias voltage with respect to the first synaptic column based on the second control code. The second bias voltage may be the same as the first bias voltage. Accordingly, the spike neural network circuit 100 may perform a self-correction operation on a synaptic column on which the self-correction operation is not performed.

In operation S143, the spike neural network circuit 100 may determine whether the count signal is greater than the reference number. When it is determined that the count signal is greater than the reference number, operation S144 may be performed. When it is determined that the count signal is not greater than the reference number, operation S145 may be performed.

In operation S144, the spike neural network circuit 100 may generate the first comparison signal indicating a first operation value. For example, the first operation value may indicate '−1'. Accordingly, the spike neural network circuit 100 may generate the second control code by adding the first control code to the first operation value. The spike neural network circuit 100 may generate a second bias voltage obtained by correcting the first bias voltage with respect to the first synaptic column based on the second control code. The second bias voltage may be less than the first bias voltage.

In operation S145, the spike neural network circuit 100 may generate a first comparison signal indicating a second operation value. For example, the second operation value may indicate '+1'. Accordingly, the spike neural network circuit 100 may generate the second control code by adding the first control code to the second operation value. The spike neural network circuit 100 may generate a second bias voltage obtained by correcting the first bias voltage with respect to the first synaptic column based on the second control code. The second bias voltage may be greater than the first bias voltage.

According to an embodiment of the present disclosure, a spike neural network circuit including a self-correcting control circuit and a method of operating the same are provided.

In addition, according to an embodiment of the present disclosure, provided is a spike neural network circuit in which reliability of a neural network operation is improved and a yield of a semiconductor device is improved by adjusting a bias voltage based on a difference between a target value and an actual value.

The above description refers to embodiments for implementing the present disclosure. Embodiments in which a design is changed simply or which are easily changed may be included in the present disclosure as well as an embodiment described above. In addition, technologies that are easily changed and implemented by using the above embodiments may be included in the present disclosure. While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A spike neural network circuit comprising:

a self-correcting control circuit configured to generate an input signal and a first control code;

a bias voltage generation circuit configured to generate a first bias voltage based on the first control code;

a synaptic circuit including a first synaptic column configured to perform an operation of the input signal and a first weight signal based on the first bias voltage and to generate a first operation signal;

a neuron circuit including a first neuron configured to generate a first output signal based on a comparison of the first operation signal and a threshold voltage; and a spike comparison circuit configured to generate a first comparison signal corresponding to a difference between an actual number of pulses included in the first output signal and a target number of pulses indicated by a reference number, and wherein the self-correcting control circuit is further configured to generate a second control code for correcting the first bias voltage based on the first control code and the first comparison signal, wherein the bias voltage generation circuit is further configured to generate a second bias volage that is the same as the first bias voltage based on the second control code when the actual number of pulses in the first output signal is the same as the target number of pulses, and configured to generate the second bias voltage different from the first bias voltage based on the second control code when the actual number of pulses in the first output signal is different from the target number of pulses, and wherein the self-correcting control circuit is further configured to generate the second control code so as to make the bias voltage generation circuit generate the second bias voltage greater than the first bias voltage when the actual number of pulses is less the target number of pulses, and so as to make the bias voltage generation circuit generate the second bias voltage smaller than the first bias voltage when the actual number of pulses is greater than the target number of pulses.

2. The spike neural network circuit of claim 1, wherein the bias voltage generation circuit is further configured to generate a second bias voltage for a second synaptic column based on the first control code, wherein the synaptic circuit further includes the second synaptic column configured to perform an operation of the input signal and a second weight signal based on the second bias voltage for the second synaptic column and to generate a second operation signal, wherein the neuron circuit further includes a second neuron configured to generate a second output signal based on a comparison of the second operation signal and the threshold voltage, wherein the spike comparison circuit further generates a second comparison signal corresponding to a difference between the second output signal and the reference number, and wherein the self-correcting control circuit is further configured to generate a third control code based on the first control code and the second comparison signal.

3. The spike neural network circuit of claim 2, wherein the bias voltage generation circuit generates a third bias voltage obtained by correcting the first bias voltage for the first synaptic column, based on the second control code, and wherein the bias voltage generation circuit is further configured to generate a fourth bias voltage obtained by correcting the second bias voltage for the second synaptic column, based on the third control code.

4. The spike neural network circuit of claim 1, wherein, when the actual number of pulses included in the first output signal is less than the target number of pulses indicated by the reference number, the bias voltage generation circuit generates the second bias voltage greater than the first bias voltage.

5. The spike neural network circuit of claim 1, wherein the first synaptic column includes a plurality of synapses, wherein each of the plurality of synapses generates at least a portion of the first operation signal, based on the first bias voltage, the input signal, and a corresponding weight, and wherein the neuron is configured to generate a pulse of the first output signal when a magnitude of the first operation signal is greater than or equal to the threshold voltage.

6. The spike neural network circuit of claim 1, wherein the spike comparison circuit includes:

a counter configured to generate a count signal indicative of the number of pulses included in the first output signal; and a comparator configured to generate the first comparison signal based on the count signal and the reference number.

7. The spike neural network circuit of claim 6, wherein, when the count signal is greater than the reference number, the first comparison signal indicates a first operation value, wherein, when the count signal is less than the reference number, the first comparison signal indicates a second operation value, and wherein, when the count signal is equal to the reference number, the first comparison signal indicates a third operation value.

8. The spike neural network circuit of claim 1, wherein the second control code is a sum of the first control code and the first comparison signal.

9. The spike neural network circuit of claim 1, wherein an input signal is a plurality of input signals and the first synaptic column includes a plurality of synapses, wherein the self-correcting control circuit is connected to the plurality of synapses to transmit the plurality of input signals to the plurality of synapses, respectively.

10. The spike neural network circuit of claim 1, wherein the bias voltage generation circuit includes a voltage dividing circuit configured to generate the first bias voltage based on the second control code, and wherein the voltage dividing circuit includes a plurality of first transistors connected to a plurality of second transistors, respectively, the plurality of first transistors having widths different from each other, each of the plurality of second transistors being configured to be turned on in response to the second control code to generate the first bias voltage.

11. A method of operating a spike neural network circuit including a plurality of synaptic columns and a neuron circuit, the method comprising:

generating a first bias voltage corresponding to a first synaptic column among the plurality of synaptic columns, based on a first control code;

performing an operation on a first input signal and a first weight signal based on the first bias voltage and generating a first operation signal, by the first synaptic column;

comparing the first operation signal and a threshold voltage and generating a first output signal, by the neuron circuit;

generating a first comparison signal corresponding to a difference between an actual number of pulses included in the first output signal and a target number of pulses indicated by a reference number;

generating a second control code for correcting the first bias voltage, based on the first comparison signal and the first control code;

generating a second bias volage that is the same as the first bias voltage based on the second control code when the actual number of pulses in the first output signal is the same as the target number of pulses; and generating the second bias voltage different from the first bias voltage based on the second control code when the actual number of pulses in the first output signal is different from the target number of pulses, wherein the second bias voltage greater than the first bias voltage is generated when the actual number of pulses is less the target number of pulses, and the second bias voltage smaller than the first bias voltage is generated when the actual number of pulses is greater than the target number of pulses.

12. The method of claim 11, further comprising:

wherein, when the actual number of pulses included in the first output signal is less than the target number of pulses indicated by the reference number, the second bias voltage is greater than the first bias voltage.

13. The method of claim 11, further comprising:

generating a second bias voltage corresponding to a second synaptic column among the plurality of synaptic columns, based on the first control code;

performing an operation of the input signal and a first weight signal based on the second bias voltage corresponding to the second synaptic column, by the second synaptic column, and generating a second operation signal;

comparing the second operation signal and the threshold voltage and generating a second output signal, by the neuron circuit;

generating a second comparison signal corresponding to a difference between the second output signal and the reference number; and generating a third control code for correcting the second bias voltage, based on the second comparison signal and the first control code.

* * * * *